United States Patent
Bucur et al.

(10) Patent No.: US 7,999,554 B2
(45) Date of Patent: Aug. 16, 2011

(54) SINGLE FLOATING BATTERY CELL VOLTAGE LEVEL TRANSLATOR CIRCUITRY

(75) Inventors: Constantin Bucur, Santa Clara, CA (US); Marian Niculae, San Jose, CA (US)

(73) Assignee: O2Micro International Limited, Georgetown, Grand Cayman (KY)

( * ) Notice: Subject to any disclaimer, the term of this patent is extended or adjusted under 35 U.S.C. 154(b) by 150 days.

(21) Appl. No.: 11/264,768

(22) Filed: Nov. 1, 2005

(65) Prior Publication Data

US 2006/0197501 A1    Sep. 7, 2006

Related U.S. Application Data

(60) Provisional application No. 60/659,330, filed on Mar. 7, 2005.

(51) Int. Cl.
*H02J 7/00* (2006.01)
*G01N 27/416* (2006.01)
(52) U.S. Cl. ........ 324/434; 324/433; 324/435; 320/112; 320/118; 320/120; 320/124; 320/125
(58) Field of Classification Search .................. 320/112, 320/116, 118, 119, 124, 125, 162; 324/433, 324/434, 435
See application file for complete search history.

(56) References Cited

U.S. PATENT DOCUMENTS

| | | | |
|---|---|---|---|
| 4,521,741 A | | 6/1985 | Ruberl |
| 4,636,705 A | | 1/1987 | Bowman |
| 5,089,821 A | | 2/1992 | Mori et al. |
| 5,650,753 A | * | 7/1997 | Ling .......................... 330/253 |
| 5,712,568 A | * | 1/1998 | Flohr et al. .................. 324/434 |
| 5,914,606 A | * | 6/1999 | Becker-Irvin ................ 324/434 |
| 5,990,659 A | | 11/1999 | Frannhagen |
| 6,084,478 A | | 7/2000 | Mayampurath |
| 6,140,820 A | * | 10/2000 | James ......................... 324/434 |
| 6,411,097 B1 | * | 6/2002 | Ashtiani et al. ............. 324/434 |
| 6,417,646 B1 | * | 7/2002 | Huykman et al. ........... 320/122 |
| 6,577,883 B1 | | 6/2003 | Ueda |
| 7,495,657 B2 | | 2/2009 | Cheng |
| 2003/0096158 A1 | | 5/2003 | Takano |
| 2003/0107347 A1 | | 6/2003 | Yoshizawa et al. |

(Continued)

OTHER PUBLICATIONS

English translation of Taiwanese Office Action dated Nov. 7, 2007 received in corresponding Taiwan Application No. 095104657 (8 pages).

(Continued)

*Primary Examiner* — Edward Tso
*Assistant Examiner* — Johali A. Torres Ruiz
(74) *Attorney, Agent, or Firm* — Grossman, Tucker, Perreault & Pfleger, PLLC (57) ABSTRACT

Voltage translator circuitry may include a path including a first resistor, a current controlling device, and a second resistor coupled in series. The voltage translator circuitry may further include an operational amplifier having a positive supply terminal to accept a positive supply voltage and a negative supply terminal to accept a negative supply voltage, neither the positive or negative supply voltage at ground voltage. The first resistor may further be coupled to a positive terminal of the battery cell to be monitored. The operational amplifier may have an input coupled to a negative terminal of the battery cell to be monitored. The voltage translator circuitry may further include an output terminal coupled to a node of the path between the current controlling device and the second resistor. The output terminal may be configured to provide the ground referenced cell voltage for the battery cell.

15 Claims, 4 Drawing Sheets

U.S. PATENT DOCUMENTS

| | | |
|---|---|---|
| 2005/0024337 A1 | 2/2005 | Cheng |
| 2005/0134232 A1 | 6/2005 | Yamamoto |
| 2005/0280393 A1 | 12/2005 | Feldmann |
| 2006/0006840 A1* | 1/2006 | Furukawa ............ 320/116 |

OTHER PUBLICATIONS

English Translation of Chinese Office Action received in corresponding Chinese Application No. 2006200568373 on Oct. 15, 2007 (4 pages).

English translation of Chinese Office Action issued in related Chinese Patent Application No. 2006100568369 received Jan. 4, 2008 (1 page).

English translation of Chinese Office Action received in Chinese Patent Application No. 2006100568388 dated Feb. 1, 2008.

U.S. Office Action dated Jun. 12, 2008 issued in related U.S. Appl. No. 11/234,908.

U.S. Office Action dated Jan. 5, 2009 issued in related U.S. Appl. No. 11/234,908.

Notice of Allowance Office Action dated Jul. 17, 2009 issued in related U.S. Appl. No. 11/234,908.

U.S. Office Action dated Sep. 18, 2009 issued in related U.S. Appl. No. 11/235,583.

U.S. Office Action dated May 19, 2009 issued in related U.S. Appl. No. 11/235,583.

U.S. Office Action dated Nov. 6, 2008 issued in related U.S. Appl. No. 11/235,583.

U.S. Office Action dated Jun. 6, 2008 issued in related U.S. Appl. No. 11/235,583.

U.S. Office Action dated Sep. 17, 2007 issued in related U.S. Appl. No. 11/235,583.

Notice of Allowance dated Dec. 22, 2010 issued in related U.S. Appl. No. 12/729,475.

Office Action dated Dec. 10, 2010 issued in related U.S. Appl. No. 12/729,492.

Office Action dated Nov. 23, 2010 issued in related U.S. Appl. No. 11/235,583.

Office Action from related U.S. Appl. No. 12/729,475 mailed Jun. 11, 2010.

Notice of Allowance from related U.S. Appl. No. 12/729,475 mailed Oct. 18, 2010.

Office Action from related U.S. Appl. No. 12/729,492 mailed Jun. 10, 2010.

Office Action from related U.S. Appl. No. 11/235,583 mailed Jun. 1, 2010.

U.S. Notice of Allowance dated Oct. 28, 2010 issued in U.S. Appl. No. 11/234,908, 12 pages.

* cited by examiner

SINGLE FLOATING BATTERY CELL VOLTAGE LEVEL TRANSLATOR CIRCUITRY

CROSS REFERENCE TO RELATED APPLICATIONS

This application claims the benefit of the filing date of U.S. Provisional Application Ser. No. 60/659,330, filed Mar. 7, 2005, the teachings of which are incorporated herein by reference.

FIELD

The present disclosure relates to a battery pack for cordless electrical devices, and more particularly to single floating battery cell voltage translator circuitry that may be a component of the battery pack.

BACKGROUND

Various cordless electrical devices may be powered by a battery pack. Examples of such cordless electrical devices include, but are not limited to, laptop computers, cell phones, personal digital assistants, and power tools such as a drill. The battery pack may include a plurality of battery cells and power switches to allow the battery cells to either supply current (discharge operation mode) or to be charged (charge operation mode). A variety of monitoring functions may be performed by circuitry of the battery pack to maintain a safe and desired use of the battery cells. As part of this and other monitoring efforts, cell voltage levels for each battery cell may be monitored. The monitored cell voltage level may be a floating or line to line cell voltage. The floating voltage measurement may be taken across the positive and negative terminals of each battery cell. In some instances, it may be desirable to translate this floating cell voltage to a ground referenced voltage.

One conventional approach to translating the floating cell voltage to a ground referenced voltage may be to utilize a differential operational amplifier with four externally coupled resistors. However, for battery packs having two or more series connected battery cells, this conventional approach requires the use of a high voltage operational amplifier to accommodate the relatively large potential difference between the inputs of the operational amplifier. A high voltage operational amplifier may have a supply voltage between about 10 volts and 40 volts and may have larger common-mode gain and offset voltage errors as compared to a low voltage operational amplifier having a supply voltage less than or equal to about 5 volts. These errors may then need to be corrected by balancing all four resistor values in a complex calibration process that may require making fine adjustments to at least one of the four resistors.

Accordingly, there is a need for single floating cell voltage level translator circuitry that reduces voltage translation error and simplifies calibration.

BRIEF SUMMARY OF THE INVENTION

According to one aspect of the invention, there is provided voltage translator circuitry for translating a floating cell voltage of a battery cell to a ground referenced cell voltage. The voltage translator circuitry may include a path including a first resistor, a current controlling device, and a second resistor coupled in series. The voltage translator circuitry may further have an operational amplifier having a positive supply terminal to accept a positive supply voltage and a negative supply terminal to accept a negative supply voltage, neither the positive or negative supply voltage at ground voltage. The operational amplifier may also have a first input coupled to a first node of the path between the first resistor and the current controlled device. The first resistor may further be coupled to a positive terminal of the battery cell to be monitored. The operational amplifier may have a second input coupled to a negative terminal of the battery cell to be monitored. The voltage translator circuitry may further include an output terminal coupled to a second node of the path between the current controlling device the second resistor. The output terminal may be configured to provide the ground referenced cell voltage for the battery cell when the first resistor is coupled to the positive terminal of the battery cell and the second input of the operational amplifier is coupled to the negative terminal of the battery cell.

According to another aspect of the invention, there is provided a battery pack. The battery pack may include a plurality of battery cells, a switch network, and voltage translator circuitry. The voltage translator circuitry may include a path including a first resistor, a current controlling device, and a second resistor coupled in series. The voltage translator circuitry may further have an operational amplifier having a positive supply terminal to accept a positive supply voltage and a negative supply terminal to accept a negative supply voltage, neither the positive or negative supply voltage at ground voltage. The operational amplifier may also have a first input coupled to a first node of the path between the first resistor and the current controlled device. The first resistor may further be coupled to a positive terminal of one battery cell of the plurality of battery cells to be monitored via the switch network. The operational amplifier may have a second input coupled to a negative terminal of the one battery cell to be monitored. The voltage translator circuitry may further include an output terminal coupled to a second node of the path between the current controlling device and the second resistor. The output terminal may be configured to provide the ground referenced cell voltage for the one battery cell when the first resistor is coupled to the positive terminal of the one battery cell and the second input of the operational amplifier is coupled to the negative terminal of the one battery cell.

According to yet another aspect of the invention there is provided a method of translating a floating cell voltage of a battery cell to a ground referenced cell voltage. The method may include: setting a first voltage at a first input of an operational amplifier equal to a second voltage at a second input of the operational amplifier, the second voltage further equal to a voltage of a negative terminal of one battery cell of a plurality of battery cells to be monitored, the operational amplifier having a positive supply terminal to accept a positive supply voltage and a negative supply terminal to accept a negative supply voltage, neither the positive or negative supply voltage at ground voltage; controlling a current through a path by controlling a current controlling device in response to an output of the operational amplifier, the path including a first resistor, the current controlling device, and a second resistor coupled in series; and providing the ground referenced cell voltage at an output terminal coupled to a second node of the path between the current controlling device and the second resistor when the first resistor is coupled to a positive terminal of the one battery cell and the second input of the operational amplifier is coupled to the negative terminal of the one battery cell.

BRIEF DESCRIPTION OF THE DRAWINGS

Features and advantages of embodiments of the claimed subject matter will become apparent as the following Detailed Description proceeds, and upon reference to the Drawings, where like numerals depict like parts, and in which:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1A:
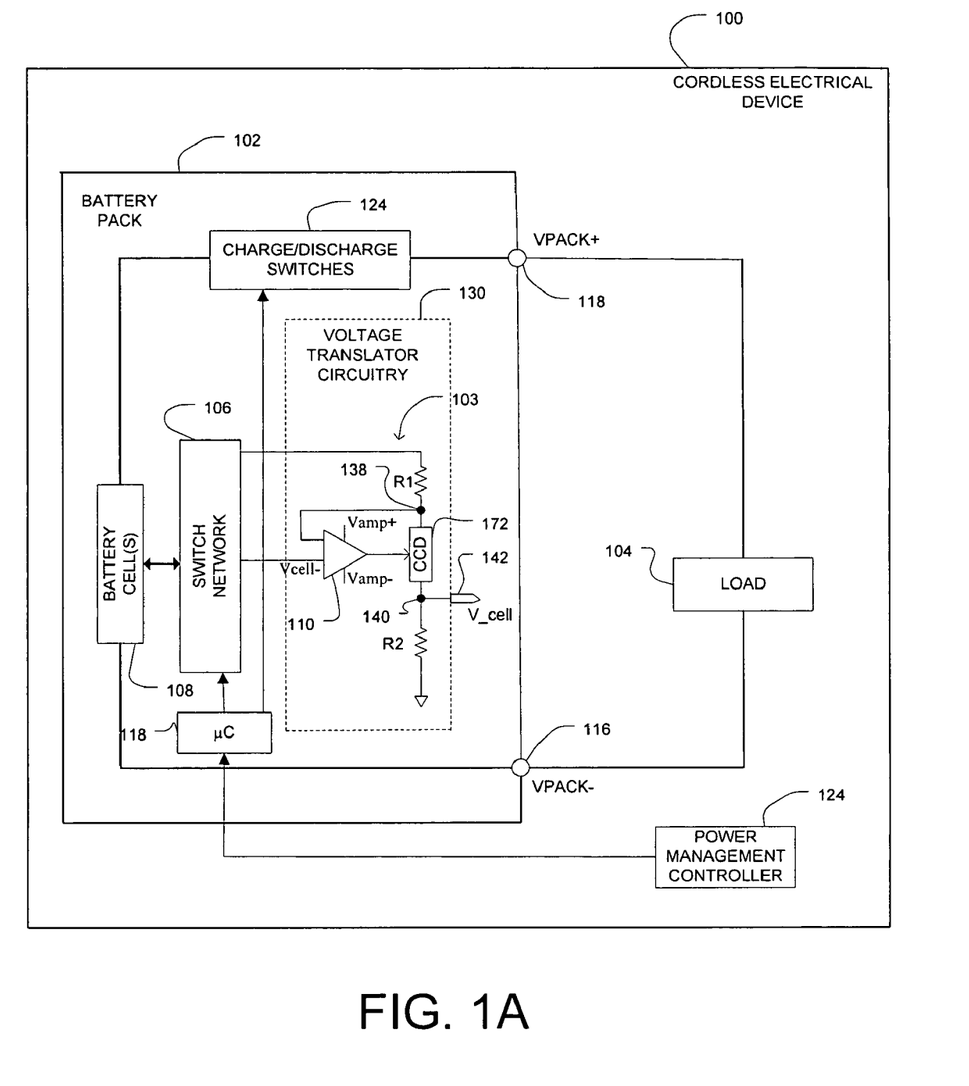
FIG. 1A is a diagram of a cordless electrical device having a battery pack with voltage translator circuitry consistent with the invention.

FIG. 1A illustrates a cordless electrical device 100 having a battery pack 102 that may provide power to the load 104 during a battery supply mode. The load 104 may represent the entire load of the device 100 that may be coupled to the VPACK+ terminal 118 and the VPACK− terminal 116 of the battery pack 102. The cordless electrical device 100 may include, but not be limited to, a laptop computer, a cell phone, a personal digital assistant, and a power tool such as a drill, a circular saw, a sander, etc. In one embodiment, the load 104 may be the power tool itself when the cordless electrical device is a power tool. In addition to providing power to the load 104 in the battery supply mode, the battery pack 102 may also be recharged by a DC power source (not illustrated) such as an ACDC adapter in a battery charge mode. The battery pack 102 may include charge and discharge switches 124 to facilitate operation of the battery pack 102 in the battery supply mode and battery charge mode.

The battery pack 102 may include one or more battery cells 108, a switch network 106, a microcontroller 118, and voltage translator circuitry 130 consistent with the invention. The battery cells 108 may be any variety of battery chemistries such as lithium ion cells. The switch network 106 may be responsive to a control signal from a variety of sources such as the microcontroller 118 to select one of the battery cells 108 for coupling to the voltage translator circuitry 130. The microcontroller 118 may also receive and execute instructions from the power management controller 124 that may include instructions on which battery cell to couple to the voltage level translator circuitry 130. The microcontroller 118 may also control the state of the charge and discharge switches 124.

In general, the voltage translator circuitry 130 may translate a floating battery cell voltage to a ground referenced voltage. The voltage translator circuitry 130 may include a path 103 that includes a first resistor R1, a current controlling device (CCD) 172 (which may be implemented as a transistor) and a second resistor R2 coupled in series. The voltage translator circuitry 130 may further include an operational amplifier 110 and an output terminal 142. The operational amplifier 110 may be low voltage operational amplifier and may later be referred to as such herein. A low voltage operational amplifier may have a supply voltage equal to about 5 volts or less. For instance, a low voltage amplifier may have a positive supply terminal to accept a positive supply voltage, Vamp+, and a negative supply terminal to accept a negative supply voltage, Vamp−. With a floating supply having neither the positive or negative supply voltage at ground voltage, a low voltage operational amplifier may have the positive supply voltage less the negative supply voltage at a differential supply voltage level which is less than or equal to about 5 volts. For example, if V1 is the positive supply voltage and V2 is the negative supply voltage, V1 and V2 may have variable levels, V1 may be greater than V2, and V1-V2 may be less than or equal to about 5 volts. In one embodiment, the low voltage floating supply voltage may be 3.3 volts. In contrast, a conventional operational amplifier may have a fixed voltage level for V1 or Vamp+ and V2 or Vamp− may be at ground (0) potential. The low voltage operational amplifier 110 may also be a high accuracy, high gain, low offset, floating supply operational amplifier. A high gain may mean a gain of greater than 120 dB.

The operational amplifier 110 may have a first input coupled to a first node 138 of the path 103 between the first resistor R1 and the current controlling device 172. The first resistor R1 may further be coupled to the positive terminal of a battery cell to be monitored via the switch network 106. The operational amplifier 110 may have a second input coupled to the negative terminal of the battery cell to be monitored via the switch network 106.

The output terminal 142 may be coupled to a second node 140 of the path 103 between the current controlling device 172 and the second resistor R2. The output terminal 142 may be configured to provide a ground referenced cell voltage for the battery cell being monitored when the first resistor R1 is coupled to the positive terminal of the battery cell being monitored via the switch network 106 and the second input of the operational amplifier 110 is coupled to the negative terminal of the battery cell being monitored via the switch network 106.

Once coupled to a particular battery cell to be monitored, the floating cell voltage will be set across the first resistor since the reaction loop formed by the operational amplifier 110 and the current controlling device 172 will drive the first input voltage of the operational amplifier 110 to be set at the same voltage level as the second input voltage level, i.e., the voltage on the negative terminal of the currently selected battery cell or Vcell−. Consequently, the floating cell voltage is translated to a ground referenced voltage at the output terminal 142. Since the same current flows through both the first resistor R1 and the second resistor R2, the translation gain, namely the ratio between the translated voltage (across resistor R2) and the cell voltage (across resistor R1) is given by the ratio of the value of the second resistor divided by the value of the first resistor of R2/R1. The ratio R2/R1 may be chosen depending on a particular application. For instance, if the ground referenced cell voltage is being provided to a ground referenced analog to digital converter (ADC) with a 1 volt full scale range and a maximum battery cell voltage is 4 volts, the R2/R1 ratio may be 1:4. If the ADC has a 4 volt full scale range for the same maximum battery cell voltage, the R2/R1 ratio may be 1:1.

Figure 1B:
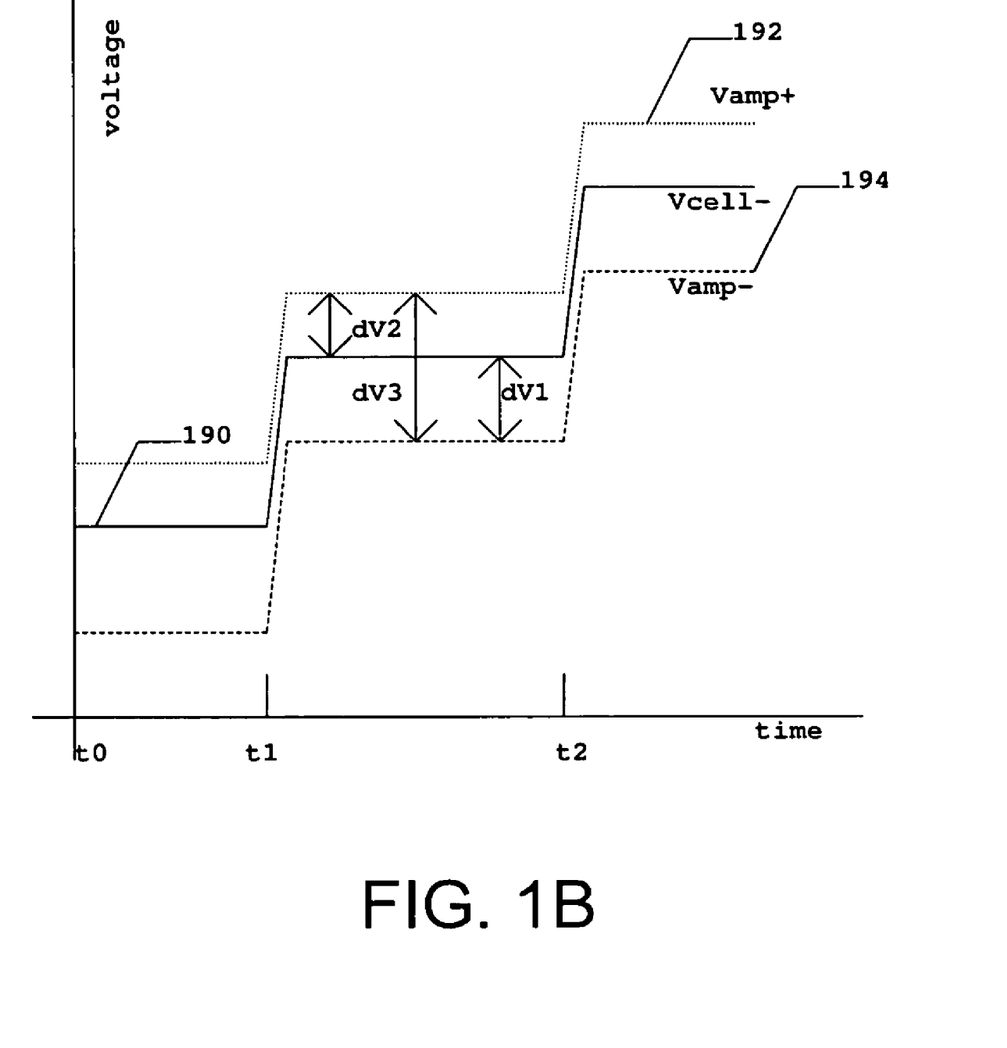
FIG. 1B illustrates exemplary plots of supply voltage for the operational amplifier of FIG. 1A as input voltage to the operational amplifier changes with a selected battery cell.

Turning to FIG. 1B, exemplary plots of positive and negative supply voltage for the operational amplifier of FIG. 1A are illustrated over time as the input voltage to the operational amplifier 110 changes in response to a selected battery cell. As earlier detailed, when translating the battery cell voltage of a particular cell, both inputs of the operational amplifier 110 will stay at the same voltage level. In particular, this voltage level may be the voltage level of the negative terminal of the monitored battery cell or Vcell− as illustrated in plot 190. The voltage level of plot 190 may increase as the measured battery cell is placed higher in a stack of battery cells coupled in series since it may be the sum of all the battery cell voltages underneath the monitored battery cell. For instance, at times t1, t2, and t3, the selected battery cell may change to increase Vcell− by a corresponding amount.

In order to utilize a low voltage operational amplifier, the positive supply voltage (Vamp+) to the positive supply terminal of the operational amplifier 110 and the negative supply voltage (Vamp−) to the negative supply terminal of the operational amplifier 110 need to be adjusted in response to which one of the plurality of battery cells 108 is being monitored. The positive supply voltage Vamp+ as represented by plot 192 may be adjusted to maintain the positive supply voltage greater than an associated input voltage of the operational amplifier 110 which is equal to Vcell− in this instance as that value changes. For instance, as Vcell− is increased at time t1 due to a change in the selected battery cell, plot 192 also increases so that the positive supply voltage Vamp+ is greater than a corresponding input to the operational amplifier 110 or Vcell− in this instance.

The negative supply voltage Vamp− as represented by plot 194 may also be adjusted to maintain the negative supply voltage less than an associated input voltage of the operational amplifier 110 which is also equal to Vcell− in this instance. The first difference dV1 between plots 190 and 194 and the second difference dV2 between plots 192 and 190 should be selected to be small enough so that the supply voltage to the operational amplifier 110 as represented by the third difference dV3 remains in a low voltage range, e.g., equal to or less than about 5 volts.

Figure 2:
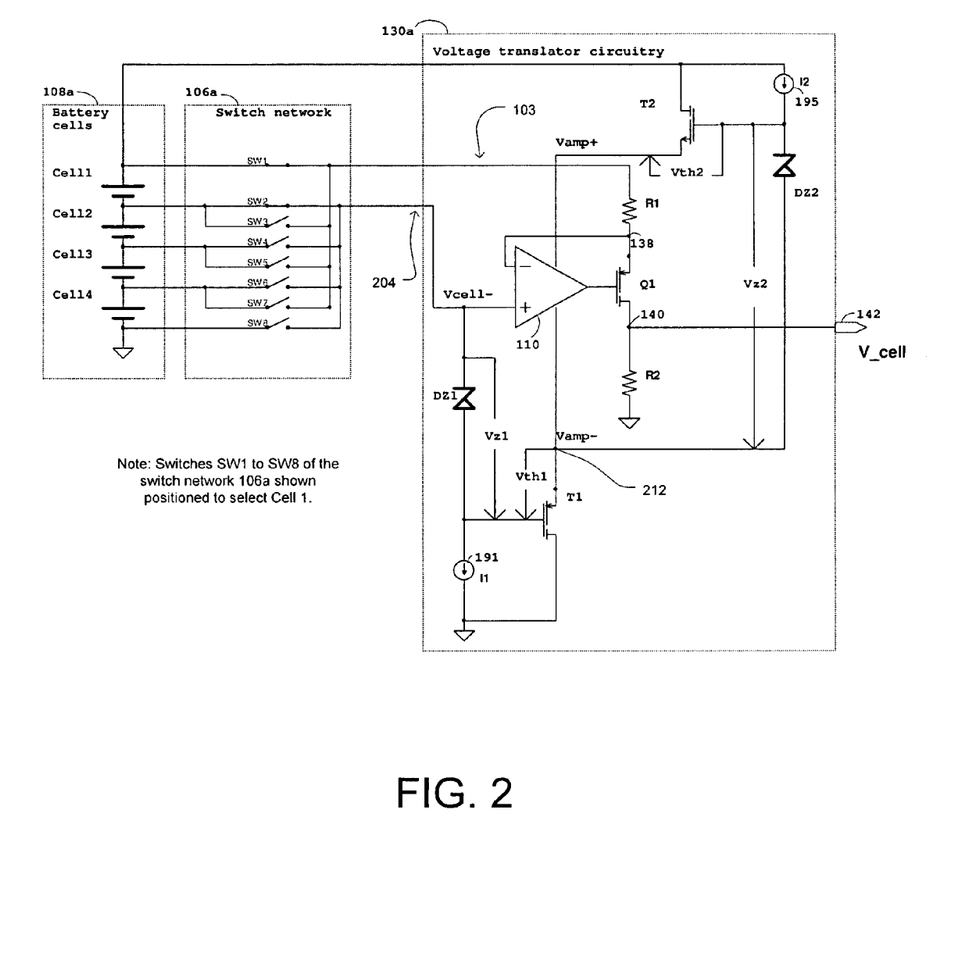
FIG. 2 is a circuit diagram of an embodiment of the voltage translator circuitry of FIG. 1.

FIG. 2 is a circuit diagram of one embodiment 130a of the voltage translator circuitry 130 consistent with the circuitry 130 of FIG. 1 which shows in more detail floating power supply circuitry for the low voltage operational amplifier 110 that operates consistent with the plots of FIG. 1B. FIG. 2 also illustrates an embodiment 108a of battery cells including four battery cells and an embodiment 106a of a switch network 106. Compared to the voltage translator circuitry 130 of FIG. 1, the voltage level translator circuitry 130a may also include a P-channel metal oxide semiconductor field effect transistor (MOSFET) transistor Q1 functioning as the current controlling device 172. The control or gate terminal of the MOSFET Q1 may receive an output signal from the operational amplifier 110. The source terminal of the MOSFET Q1 may be coupled to the first resistor R1 via the first node 138. The drain terminal of the MOSFET Q1 may be coupled to the second resistor R2 via the second node 140. In this embodiment, since a P-channel MOSFET is utilized as the transistor Q1, the operational amplifier 110 has its noninverting input coupled to the monitored battery cell's negative terminal, Vcell−, and the inverting input coupled to the source of MOSFET Q1 via the node 138.

Individual floating cell voltage levels for each cell of the battery cells 108a may be monitored through the switch network 106a by the voltage translator circuitry 130a. The monitored floating cell voltage level may then be translated to a ground referenced voltage level by the voltage translator circuitry 130a. For instance, when the first cell (CELL 1) is to be monitored by the voltage level translator circuitry 130a, switches SW1 and SW2 of the switch network 106a may close, while all other switches may remain open. These switch positions are illustrated in the switch network 106a of FIG. 2. As such, the positive terminal of the first cell (CELL 1) may be coupled through switch SW1 to the first resistor R1 of the path 103. In addition, the negative terminal of the first cell (CELL 1) may be coupled through switch SW2 and path 204 to the noninverting input terminal of the operational amplifier 110. All switches of the switch network 106a may remain in these positions until a translation of the floating cell voltage for the first cell (CELL 1) to a ground referenced voltage is complete.

When the second cell (CELL 2) is to be monitored by the voltage translator circuitry 130a, switches SW3 and SW4 may be closed while other switches of the switch network 106a may remain open. When the third cell (CELL 3) is to be monitored by the voltage level translator circuitry 130a, switches SW5 and SW6 may be closed while other switches of the switch network 106a may remain open. Finally, when the fourth cell (CELL 4) is to be monitored by the voltage level translator circuitry 130a, switches SW7 and SW8 may be closed while other switches of the switch network 106a may remain open.

In addition, floating power supply circuitry of the voltage translator circuitry 130a may adjust the Vamp+ and Vamp− supply voltage provided to the positive and negative terminals of the operational amplifier 110 to appropriate levels in response to which one of the plurality of battery cells 108a is selected for monitoring consistent with that illustrated in FIG. 1B. These appropriate levels may result in a Vamp+ greater than an input voltage at the inverting input terminal to the operational amplifier 110, a Vamp− less than an input voltage at the noninverting input terminal of the operational amplifier 110, and a differential supply voltage (Vamp+ less Vamp−) that is equal to a low voltage level of less than or equal to about 5 volts.

In the embodiment of FIG. 2, the floating power supply circuitry may include a first voltage regulating device, e.g., a first Zener diode DZ1, a first current source 191, a first transistor T1, a second voltage regulating device, e.g., a second Zener diode DZ2, a second current source 195, and a second transistor T2. The cathode of the first Zener diode DZ1 may be connected to the negative terminal of the currently selected battery cell. The current source 191 may set an internal current I1 driven through the first Zener diode DZ1 so that the voltage across the first Zener diode DZ1 may be equal to Vz1 as illustrated in FIG. 2. The anode of the first Zener diode DZ1 may be connected to the control terminal of a properly chosen supply transistor T1. In this embodiment, the transistor T1 may be a P-channel MOSFET. The source terminal of the MOSFET T1 may be connected to the negative supply terminal of the operational amplifier 110 while the drain of MOSFET T1 may be connected to ground. As those skilled in the art can calculate, the negative supply voltage Vamp− may be approximated as given in equation (1):

$$Vamp-=(Vcell-)-Vz1+Vth1; \quad (1)$$

where Vcell− is the voltage on the negative terminal of the currently measured battery cell, Vz1 is the voltage drop across the first Zener diode DZ1, and Vth1 is the threshold voltage (source to gate voltage) of transistor T1. The first Zener diode DZ1, the current source 191, and the transistor T1 may be designed such that Vz1>Vth1, where Vz1-Vth1 may be expressed as dV1 so that equation (1) may be rewritten as Vamp−=(Vcell−)−dV1. Therefore, the value dV1 (e.g., which is equal to dV1 of FIG. 1B) may be selected so the negative voltage supply Vamp− provided to the operational amplifier 110 may be placed a desired amount less than the input voltage (Vcell−). For example, if Vz1=4V and Vth1=1V, Vamp−=(Vcell−)−3V Similarly, the anode of the second Zener diode DZ2 may be connected to node 212 which may be further connected to the negative supply terminal of the operational amplifier 1110. The second current source 195 may push a current I2 from the most positive terminal of the battery pack 108a. Accordingly, the voltage drop across the second Zener diode DZ2 will be Vz2. The cathode of the second Zener diode DZ2 may be coupled to the control terminal of the second properly chosen transistor T2. Transistor T2 may be an n-channel MOSFET in the embodiment of FIG. 2. The source terminal of the MOSFET T2 may be connected to the positive supply terminal of the operational amplifier 110 while the drain of MOSFET T2 may be connected to the most positive terminal of the battery pack. The positive supply voltage level, Vamp+, provided to the positive supply terminal of the operational amplifier 110 may be approximated as given in equation (2):

$$Vamp+ = (Vamp-) + Vz2 - Vth2; \qquad (2)$$

where Vz2 is the voltage drop across the second Zener diode DZ1, and Vth2 is the threshold voltage (gate to source voltage) of transistor T2. Substituting the expression of Vamp- from equation (1) into equation (2), equation (2) can be rewritten as:

$$Vamp+ = (Vcell-) - Vz1 + Vth1 + Vz2 - Vth2 \qquad (3)$$

Therefore, by properly designing the second Zener diode DZ2 and the second transistor T2 and setting the value of the current I2, the positive supply voltage level of the operational amplifier 110, Vamp+, may be adjusted to be greater than its input voltage (Vcell−). For example, if Vz2=6V and Vth2=1V and keeping the previous values of Vz1 and Vth1, equation (3) can be utilized to approximate Vamp+ to be equal to (Vcell−)−4V+1V+6V−1V=(Vcell−)+2V. In other words, +2V is equal to dV2 of FIG. 1B in this example. Therefore, the effective differential supply voltage (dV3 of FIG. 1B) provided to the operational amplifier 110 may be [Vamp+]− [Vamp−] or [(Vcell−)+2V]−[(Vcell−)−3V]=5V.

In addition to floating power supply circuitry of FIG. 2, those skilled in the art may notice other embodiments of supplying Vamp+ and Vamp− to the low voltage operational amplifier 110 consistent with the invention. For example MOS transistors or series connected MOS transistor groups, with each transistor in a diode configuration (gate connected to drain), may be used to implement the above mentioned voltage regulating devices DZ1, DZ2. Also a bipolar PNP transistor may be used for transistor T1 and/or a bipolar NPN transistor may be used for transistor T2, with the respective threshold voltages in this case being the base-emitter voltage Vbe≈0.7V.

In operation, when a cell is to be monitored by the voltage translator circuitry 130a associated switches of the switch network 106a connect the respective cell to the voltage translator circuitry. For example, if the first cell (CELL 1) is being monitored, switches SW1 and SW2 of the switch network 106a may be closed while others may be open to connect the positive terminal of the first cell to the first resistor R1 of the path 103. In addition, the negative terminal of the first cell (CELL 1) may be coupled through switch SW2 and path 204 to the noninverting input terminal of the operational amplifier 110. The floating cell voltage for the first cell (CELL 1) may then be set across the first resistor R1. The operational amplifier 110 controls the current through the MOSFET Q1 and resistors R1 and R2 to translate the floating battery cell voltage to a ground referenced voltage available at the output terminal 142. The translation gain may depend only on the ratio of the first resistor R1 and the second resistor R2, e.g., R2/R1.

Any voltage that is common between the noninverting input terminal and inverting input terminal of the operational amplifier 110 may be called a common-mode voltage. A theoretically ideal differential operational amplifier would have zero common-mode gain. However, real operational amplifiers have some common mode gain and the common mode rejection ratio (CMRR) may be used to quantify the common mode gain relative to the differential gain. The CMRR ratio may be one performance measurement of the operational amplifier and may be expressed as the differential voltage gain divided by the common-mode gain. The CMRR of the low voltage operational amplifier 110 may be quite high, e.g., greater than 70 dB, so that the common mode rejection of the operational amplifier 110 may be utilized to reject the common mode voltage.

Figure 3:
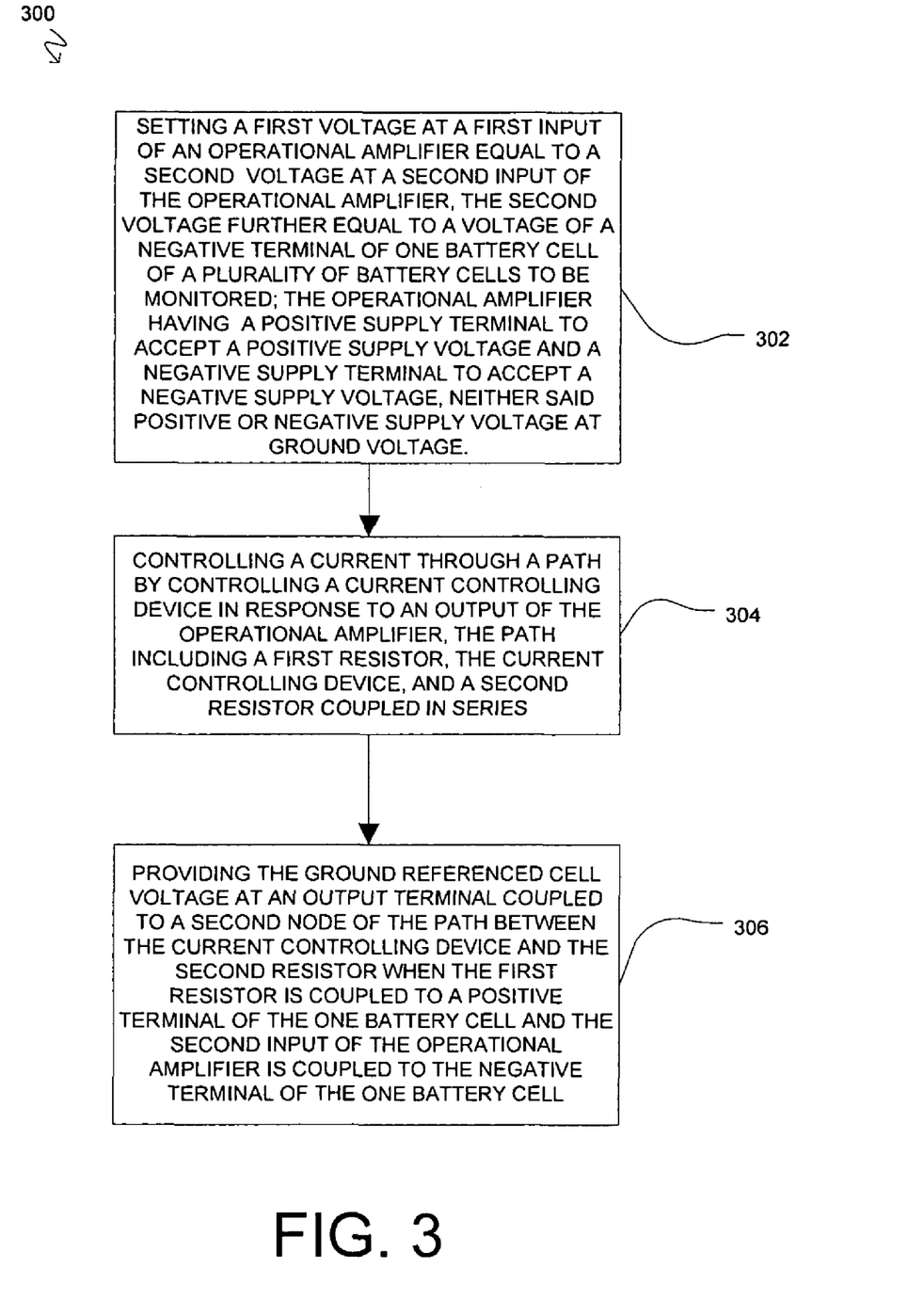
FIG. 3 is a flow chart of operations consistent with an embodiment.

FIG. 3 is a flow chart of operations 300 consistent with an embodiment for translating a floating cell voltage of a battery cell to a ground referenced cell voltage. Operation 302 may include setting a first voltage at a first input of an operational amplifier equal to a second voltage at a second input of the operational amplifier, the second voltage further equal to a voltage of a negative terminal of one battery cell of a plurality of battery cells to be monitored. The operational amplifier may have a positive supply terminal to accept a positive supply voltage and a negative supply terminal to accept a negative supply voltage, neither the positive or negative supply voltage at ground voltage. Operation 304 may include controlling a current through a path by controlling a current controlling device in response to an output of the operational amplifier, the path including a first resistor, the current controlling device, and a second resistor coupled in series. Finally, operation 306 may include providing the ground referenced cell voltage at an output terminal coupled to a second node of the path between the current controlling device and the second resistor when the first resistor is coupled to a positive terminal of the battery cell and the second input of the operational amplifier is coupled to the negative terminal of the battery cell.

Further operations may include providing a positive supply voltage to a positive terminal of the operational amplifier, and providing a negative supply voltage to a negative supply terminal of the operational amplifier, where the positive supply voltage less the negative supply voltage is a differential supply voltage less than or equal to about 5 volts. The positive and negative supply voltage levels may also be adjusted in response to which battery cell is being monitored so that the positive supply voltage is greater than the first voltage at the first input of the operational amplifier and the negative supply voltage is less than the second voltage at the second input of the operational amplifier and the differential supply voltage is still less than or equal to about 5 volts. In one embodiment, these methods of supplying the positive and negative supply voltages and adjusting the same may be accomplished by the floating power supply circuitry of FIG. 2 including the first voltage regulating device, e.g., the first Zener diode DZ1, the first current source 191, the first transistor T1, the second voltage regulating device, e.g., the second Zener diode DZ2, the second current source 195, and the second transistor T2 as previously detailed.

Advantageously, there is thus provided a single floating cell voltage level translator circuitry that reduces voltage translation error and simplifies calibration. Less external resistors also result in saved component costs and space in an environment where there is a premium on such space. In addition, common mode error during translation, especially over a wide temperature range, is difficult to control and quantify. The embodiments of the voltage level translator circuitry of FIGS. 1 and 2 eliminate common mode error entirely. The only errors may be a voltage offset error and a gain error that are highly reduced by the use of the low voltage operational amplifier 110 and relatively much easier to compensate for with microcontroller calibration. In addition, the voltage offset error and gain errors are relatively much easier to predict over a wide temperature range.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible.

What is claimed is:

1. Voltage translator circuitry for translating a floating cell voltage of at least one of a plurality of battery cells to a ground referenced cell voltage, said voltage translator circuitry comprising:
a single operational amplifier comprising:
a positive supply terminal configured to receive a positive supply voltage,
a negative supply terminal configured to receive a negative supply voltage,
an inverting input coupled to a path wherein said path is configured to be individually coupled to a positive terminal of each battery cell to be monitored, and
a noninverting input configured to be individually coupled to a corresponding negative terminal of each said battery cell to be monitored wherein a voltage, Vcell-, between said non-inverting input and a ground terminal depends on which of the plurality of battery cells is being monitored;
a first circuitry configured to adjust said negative supply voltage in response to Vcell- so that said negative supply voltage is less than Vcell- for each battery cell to be monitored, wherein said first circuitry comprises a first voltage regulating device, a first current source and a first transistor; and
a second circuitry configured to adjust said positive supply voltage in response to Vcell- so that said positive supply voltage is greater than Vcell- for each battery cell to be monitored, wherein said second circuitry comprises a second voltage regulating device, a second current source and a second transistor.

2. The voltage translator circuitry of claim 1, wherein said first voltage regulating device, said first current source and said first transistor are coupled to a third node, said first voltage regulating device is further coupled to said noninverting input, said first current source is further coupled to said ground terminal and said first transistor is further coupled to said ground terminal and said negative supply terminal, and wherein said second voltage regulating device, said second current source and said second transistor are coupled to a fourth node, said second voltage regulating device is further coupled to said negative supply terminal, said second current source is configured to be coupled to a positive terminal of said plurality of battery cells and said second transistor is configured to be coupled to said positive terminal of said plurality of battery cells and is coupled to said positive supply terminal.

3. The voltage translator circuitry of claim 1, wherein said first circuitry and said second circuitry are configured to provide a differential supply voltage to said operational amplifier and said differential supply voltage is less than or equal to 5 volts.

4. The voltage translator circuitry of claim 1, further comprising:
a switch network coupled to said single operational amplifier, said switch network configured to individually couple each of said plurality of battery cells to said single operational amplifier.

5. The voltage translator circuitry of claim 1, further comprising an output terminal, wherein:
said path comprises a first resistor, a current controlling device and a second resistor coupled in series,
said inverting input is coupled to a first node of said path between said first resistor and said current controlling device, and
said output terminal is coupled to a second node of said path between said current controlling device and said second resistor, said output terminal configured to provide said ground referenced cell voltage for each said battery cell when said first resistor is coupled to said positive terminal of said battery cell and said noninverting input is coupled to said negative terminal of said battery cell.

6. A battery pack comprising:
a plurality of battery cells;
a switch network coupled to each of said plurality of battery cells; and
voltage translator circuitry comprising:
a single operational amplifier comprising:
a positive supply terminal configured to receive a positive supply voltage,
a negative supply terminal configured to receive a negative supply voltage,
an inverting input coupled to a path wherein said path is configured to be individually coupled to a positive terminal of each battery cell to be monitored, and
a noninverting input configured to be individually coupled to a corresponding negative terminal of each said battery cell to be monitored wherein a voltage, Vcell-, between said non-inverting input and a ground terminal depends on which of the plurality of battery cells is being monitored;
a first circuitry configured to adjust said negative supply voltage in response to Vcell- so that said negative supply voltage is less than Vcell- for each battery cell to be monitored, wherein said first circuitry comprises a first voltage regulating device, a first current source and a first transistor; and
a second circuitry configured to adjust said positive supply voltage in response to Vcell- so that said positive supply voltage is greater than Vcell- for each battery cell to be monitored, wherein said second circuitry comprises a second voltage regulating device, a second current source and a second transistor.

7. The battery pack of claim 6, wherein said first voltage regulating device, said first current source and said first transistor are coupled to a third node, said first voltage regulating device is further coupled to said noninverting input, said first current source is further coupled to said ground terminal and said first transistor is further coupled to said ground terminal and said negative supply terminal, and wherein said second voltage regulating device, said second current source and said second transistor are coupled to a fourth node, said second voltage regulating device is further coupled to said negative supply terminal, said second current source is coupled to a positive terminal of said plurality of battery cells and said second transistor is coupled to said positive terminal of said plurality of battery cells and said positive supply terminal.

8. The battery pack of claim 6, wherein said first circuitry and said second circuitry are configured to provide a differential supply voltage to said operational amplifier and said differential supply voltage is less than or equal to 5 volts.

9. The battery pack of claim 6, wherein said switch network is coupled to said single operational amplifier, said switch network configured to individually couple each of said plurality of battery cells to said single operational amplifier.

10. The battery pack of claim 6, wherein said voltage translator circuitry further comprises an output terminal, and wherein:
said path comprises a first resistor, a current controlling device and a second resistor coupled in series,
said inverting input is coupled to a first node of said path between said first resistor and said current controlling device, and
said output terminal is coupled to a second node of said path between said current controlling device and said second resistor, said output terminal configured to provide said ground referenced cell voltage for each said battery cell when said first resistor is coupled to said positive terminal of said battery cell and said noninverting input is coupled to said negative terminal of said battery cell.

11. A method of translating a floating cell voltage of at least one of a plurality of battery cells to a ground referenced cell voltage, said method comprising:
for each battery cell to be monitored of the plurality of battery cells:
coupling a path to a positive terminal of said battery cell to be monitored, wherein a single operational amplifier is coupled to said path at an inverting input of said operational amplifier;
coupling a noninverting input of said single operational amplifier to a corresponding negative terminal of said battery cell to be monitored, wherein a voltage, Vcell-, between said noninverting input and a ground terminal depends on which of the plurality of battery cells is being monitored;
adjusting a negative supply voltage in response to Vcell- so that said negative supply voltage is less than Vcell- for said battery cell to be monitored, wherein said adjusting said negative supply voltage is performed by a first circuitry coupled to said noninverting input, said first circuitry comprising a first voltage regulating device, a first current source and a first transistor;
adjusting a positive supply voltage in response to Vcell- so that said positive supply voltage is greater than Vcell- for said battery cell to be monitored, wherein said adjusting said positive supply voltage is performed by a second circuitry coupled to said first circuitry, said second circuitry comprsing a second voltage regulating device, a second current source and a second transistor; and
providing said negative supply voltage to a negative supply terminal of said single operational amplifier and said positive supply voltage to a positive supply terminal of said single operational amplifier.

12. The method of claim 11, wherein said positive supply voltage less said negative supply voltage is a differential supply voltage to said single operational amplifier and said differential supply voltage is less than or equal to 5 volts.

13. The method of claim 11, wherein said coupling said path and said coupling said noninverting input are performed by a switch network.

14. The method of claim 11, further comprising:
controlling a current through said path in response to an output of said single operational amplifier wherein said inverting input is coupled to a first node of said path; and
providing said ground referenced cell voltage at an output terminal coupled to a second node of said path.

15. The method of claim 14, wherein said path comprises a first resistor, said current controlling device and a second resistor coupled in series, said first node is between said first resistor and said current controlling device and said second node is between said current controlling device and said second resistor.

* * * * *